(12) United States Patent
Liu et al.

(10) Patent No.: US 10,727,664 B2
(45) Date of Patent: Jul. 28, 2020

(54) TEMPERATURE PROTECTION CIRCUIT

(71) Applicant: Delta Electronics, Inc., Taoyuan, Taiwan (CN)

(72) Inventors: Teng Liu, Taoyuan (CN); Yong Zeng, Taoyuan (CN); Jianping Ying, Taoyuan (CN); Ming Wang, Taoyuan (CN); Xiaobo Huang, Taoyuan (CN); Jun Liu, Taoyuan (CN)

(73) Assignee: Delta Electronics, Inc., Taoyuan, Taiwan (CN)

( * ) Notice: Subject to any disclaimer, the term of this patent is extended or adjusted under 35 U.S.C. 154(b) by 0 days.

(21) Appl. No.: 16/410,151

(22) Filed: May 13, 2019

(65) Prior Publication Data

US 2019/0379201 A1    Dec. 12, 2019

(30) Foreign Application Priority Data

Jun. 11, 2018 (CN) .......................... 2018 1 0597094

(51) Int. Cl.
*H02H 7/122* (2006.01)
*H03K 17/082* (2006.01)
(Continued)

(52) U.S. Cl.
CPC ............ *H02H 7/122* (2013.01); *H02M 1/088* (2013.01); *H02M 1/36* (2013.01); *H02M 7/537* (2013.01);
(Continued)

(58) Field of Classification Search
CPC .. H02M 1/32; H02M 1/088; H02M 2001/327; H02M 7/003; H02M 7/537;
(Continued)

(56) References Cited

U.S. PATENT DOCUMENTS 6,191,956 B1 * 2/2001 Foreman ............... H02M 3/338
315/219
6,268,990 B1 * 7/2001 Ogura .............. H03K 17/08148
327/310

(Continued)

FOREIGN PATENT DOCUMENTS

CN         102646962 B     9/2014

*Primary Examiner* — Thienvu V Tran
*Assistant Examiner* — Nusrat Quddus
(74) *Attorney, Agent, or Firm* — Yunling Ren

(57) ABSTRACT

The present disclosure provides a temperature protection circuit for a power converter, including a plurality of temperature protection branches, each of the temperature protection branches comprises a resistor, a voltage source, a temperature switch, and an isolation transformer, and each of the temperature protection branches corresponds to one of the power semiconductor switch blocks, and a first end of the resistor of each of the temperature protection branches is coupled to an output electrode of the power semiconductor switch block, and a second end of the resistor is coupled to a first end of the voltage source and coupled to a first end of the contact of the temperature switch via a primary winding of the isolation transformer, a second end of the voltage source and a second end of the contact of the temperature switch are respectively coupled to the potential midpoint of the power converter.

20 Claims, 11 Drawing Sheets

(51) Int. Cl.
  *H05K 7/20*  (2006.01)
  *H02M 1/088*  (2006.01)
  *H02M 1/36*  (2007.01)
  *H02M 7/537*  (2006.01)
  *H03K 17/08*  (2006.01)

(52) U.S. Cl.
  CPC ......... *H03K 17/0828* (2013.01); *H05K 7/209* (2013.01); *H03K 2017/0806* (2013.01)

(58) Field of Classification Search
  CPC .... H02H 7/1203; H02H 7/1206; H02H 7/122; H02H 7/1225; H03K 2017/0806; H03K 17/082; H03K 17/0828; H05K 7/209; H05K 7/20945
  See application file for complete search history.

(56) References Cited

U.S. PATENT DOCUMENTS

| | | | |
|---|---|---|---|
| 6,504,697 B1 | 1/2003 | Hille | |
| RE39,065 E * | 4/2006 | Nelson | H02M 1/36 323/284 |
| 10,234,880 B1 * | 3/2019 | Li | G05F 1/571 |
| 2004/0024937 A1 * | 2/2004 | Duncan | H02M 7/003 710/100 |
| 2009/0167208 A1 * | 7/2009 | Doroshev | H05B 39/00 315/294 |
| 2013/0082762 A1 * | 4/2013 | Gan | H03K 17/0828 327/478 |
| 2013/0169035 A1 * | 7/2013 | Nakashima | H05K 7/2089 307/9.1 |
| 2013/0188397 A1 * | 7/2013 | Wu | H02J 50/10 363/17 |
| 2015/0381029 A1 * | 12/2015 | Gan | H03K 17/082 363/53 |
| 2016/0270163 A1 * | 9/2016 | Hu | H05B 45/37 |
| 2017/0012554 A1 * | 1/2017 | Pu | H02M 7/155 |
| 2017/0237339 A1 * | 8/2017 | Young | H02M 7/10 363/126 |
| 2017/0317576 A1 * | 11/2017 | Shen | H02M 7/487 |
| 2018/0123462 A1 * | 5/2018 | Wiemeyer | H02M 1/14 |
| 2018/0269866 A1 * | 9/2018 | Ying | H03K 17/168 |
| 2019/0058413 A1 * | 2/2019 | Wang | H02M 1/32 |
| 2019/0098723 A1 * | 3/2019 | Sadwick | H05B 47/175 |
| 2019/0294187 A1 * | 9/2019 | Ying | G06F 1/26 |

* cited by examiner

TEMPERATURE PROTECTION CIRCUIT

CROSS-REFERENCE TO RELATED APPLICATIONS

This application is based upon and claims priority to Chinese Patent Application No. 201810597094.3, filed on Jun. 11, 2018, the entire contents thereof are incorporated herein by reference.

TECHNICAL FIELD

The present disclosure relates to electronic circuits and, in particular, to a temperature protection circuit.

BACKGROUND

In the application of power electronic conversion technology, power devices are one of the most widely and frequently used electronic components. Power devices generate a large amount of heat during operation, so heat dissipation and temperature monitoring are required. If the heat sink is insufficient or the over-temperature protection circuit is unreliable, power device will be broken down by thermal, resulting in permanent failure of the power device.

Commonly used over-temperature protection circuits are based on thermistors or thermal temperature switches, and the temperature switches are widely used due to their simple structure, convenient use and simple protection circuit. In high-voltage and high-power applications, generally, multiple power modules share one heat sink. In this case, there is a problem of withstand voltage between a contact of the temperature switch and the outer casing. The withstand voltage problem is usually solved by using a high withstand voltage switch or adding an insulating ceramic sheet, but it has disadvantages such as increased cost or reduced temperature detection accuracy. Therefore, reducing the withstand voltage between the contact of the temperature switch and the outer casing is essential to ensure the reliable application of such temperature protection technology. In order to solve the problems of reducing the cost, increasing the temperature detection accuracy, and solving the withstand voltage between the contact of the temperature switch and the outer casing, it is urgent to improve the existing temperature protection circuit.

SUMMARY

The objective of the present disclosure is to provide a temperature protection circuit applied to a power converter for keeping the voltage between the contact of the temperature switch and the casing at a low level, while isolating turn-off or turn-on the signals of the temperature switch and the supply voltage of the power converter.

According to one aspect of the present disclosure, there is provided a temperature protection circuit for a power converter, the power converter including a control circuit, a plurality of driving circuits, a plurality of power semiconductor switch blocks connected in series, and a heat sink, each of the power semiconductor switch blocks including at least one power semiconductor switch, wherein the power converter further includes a voltage-withstanding clamping circuit connected between a potential midpoint of the power converter and the heat sink;

the temperature protection circuit includes a plurality of temperature protection branches, each of the temperature protection branches includes a resistor, a voltage source, a temperature switch, and an isolation transformer, the temperature switch includes a contact of the temperature switch and a base, and the base is disposed on the heat sink; and each of the temperature protection branches corresponds to one of the power semiconductor switch blocks, and a first end of the resistor of each of the temperature protection branches is coupled to an output electrode of the power semiconductor switch block, and a second end of the resistor is coupled to a first end of the voltage source and coupled to a first end of the contact of the temperature switch via a primary winding of the isolation transformer, a second end of the voltage source and a second end of the contact of the temperature switch are respectively coupled to the potential midpoint of the power converter, and two ends of a secondary winding of the isolation transformer are respectively coupled to the driving circuit corresponding to the corresponding power semiconductor switch or coupled to the control circuit.

According to an embodiment of the present disclosure, the power semiconductor switch block includes one power semiconductor switch, and the output electrode of the power semiconductor switch block is a collector or an emitter of the power semiconductor switch in the power semiconductor switch block.

According to an embodiment of the present disclosure, the power semiconductor switch block includes a plurality of power semiconductor switches, and the output electrode of the power semiconductor switch block is a collector or an emitter of one of the power semiconductor switches in the power semiconductor switch block.

According to an embodiment of the present disclosure, the power converter includes N power semiconductor switch blocks, where N is a natural number:

when N is an odd number, the potential midpoint of the power converter is a connection point between the $((N-1)/2)^{th}$ power semiconductor switch block and the $((N+1)/2)^{th}$ power semiconductor switch block of the power converter, or a connection point between the $((N+1)/2)^{th}$ power semiconductor switch block and the $((N+3)/2)^{th}$ power semiconductor switch block of the power converter;

when N is an even number, the potential midpoint of the power converter is a connection point between the $(N/2)^{th}$ power semiconductor switch block and the $(N/2+1)^{th}$ power semiconductor switch block of the power converter.

According to an embodiment of the present disclosure, when the contact of the temperature switch of at least one of the temperature protection branches is closed, the secondary winding of the isolation transformer of the temperature protection branch is configured to output a temperature protection signal to the driving circuit corresponding to the power semiconductor switch block which corresponds to the temperature protection branch, and the driving circuit is configured to output an turned-off driving signal to drive the power semiconductor switch corresponding to the driving circuit to be turned off.

According to an embodiment of the present disclosure, the driving circuit is configured to transmit the received temperature protection signal to the control circuit to cause the control circuit to output a turn-off control signal, to control the power semiconductor switch in each of the power semiconductor switch blocks to be turned off.

According to an embodiment of the present disclosure, when the contact of the temperature switch of at least one of the temperature protection branches is closed, the secondary winding of the isolation transformer of the temperature protection branch is configured to output a temperature protection signal to the control circuit, and the control circuit is configured to output a turned-off control signal to control the power semiconductor switch in each of the power semiconductor switch blocks to be turned off.

According to an embodiment of the present disclosure, the voltage source of each of the temperature protection branches includes a Zener diode and a capacitor connected in parallel, a cathode of the Zener diode is coupled to a first end of the capacitor and a second end of the resistor, an anode of the Zener diode is coupled to a second end of the capacitor and the potential midpoint of the power converter.

According to an embodiment of the present disclosure, each of the temperature protection branches further includes a diode, an anode of the diode is coupled to the second end of the resistor, and a cathode of the diode is coupled to the cathode of the Zener diode.

According to an embodiment of the present disclosure, when a power semiconductor switch in the power semiconductor switch block is turned on or off, a potential difference occurs between the output electrode and the heat sink.

According to another aspect of the present disclosure, there is provided a temperature protection circuit for a power converter, the power converter including a control circuit, a plurality of driving circuits, a plurality of power module blocks connected in cascade, and a heat sink, each of the power module blocks including at least one power module, wherein the power converter further includes a voltage-withstanding clamping circuit connected between a potential midpoint of the power converter and the heat sink;

the temperature protection circuit includes a plurality of temperature protection branches, each of the temperature protection branches includes a resistor, a voltage source, a temperature switch, and an isolation transformer, the temperature switch includes a contact of the temperature switch and a base, and the base is disposed on the heat sink; and each of the temperature protection branches corresponds to one of the power module blocks, and a first end of the resistor of each of the temperature protection branches is coupled to a DC terminal of the power module block, and a second end of the resistor is coupled to a first end of the voltage source and coupled to a first end of the contact of the temperature switch via a primary winding of the isolation transformer, a second end of the voltage source and a second end of the contact of the temperature switch are respectively coupled to the potential midpoint of the power converter, and two ends of a secondary winding of the isolation transformer are respectively coupled to the driving circuit corresponding to the corresponding power module or coupled to the control circuit.

According to an embodiment of the present disclosure, the power module block includes a power module, the power module includes a DC bus capacitor, and the DC terminal of the power module is a positive terminal or a negative terminal of the DC bus capacitor; or the power module includes a DC bus capacitor block, the DC bus capacitor block includes two DC bus capacitors connected in series, and the DC terminal of the power module block is a positive terminal or a negative terminal of the DC bus capacitor block or a connection point between the two DC bus capacitors.

According to an embodiment of the present disclosure, the power module block includes a plurality of power modules, each of the power modules includes one DC bus capacitor, and the DC terminal of the power module block is a positive terminal or a negative terminal of the DC bus capacitor of one of the power modules.

According to an embodiment of the present disclosure, the power module block includes a plurality of power modules, each of the power modules includes two DC bus capacitors connected in series, and the DC terminal of the power module block is a positive terminal or a negative terminal of the DC bus capacitor block of one of the power modules or a connection point between the two DC bus capacitors.

According to an embodiment of the present disclosure, the power converter includes N power module blocks, where N is a natural number;

when N is an odd number, the potential midpoint of the power converter is a connection point between the $((N-1)/2)^{th}$ power module block and the $((N+1)/2)^{th}$ power module block of the power converter, or a connection point between the $((N+1)/2)^{th}$ power module block and the $((N+3)/2)^{th}$ power module block of the power converter:

when N is an even number, the potential midpoint of the power converter is a connection point between the $(N/2)^{th}$ power module block and the $(N/2+1)^{th}$ power module block.

According to an embodiment of the present disclosure, when the contact of the temperature switch of at least one of the temperature protection branches is closed, the secondary winding of the isolation transformer of the temperature protection branch is configured to output a temperature protection signal to the driving circuit corresponding to each of the power modules in the power module block which corresponds to the temperature protection branch, and the driving circuit is configured to output an turned-off driving signal to drive the power module in the power module block corresponding to the driving circuit to be turned off.

According to an embodiment of the present disclosure, the driving circuit is configured to transmit the received temperature protection signal to the control circuit to cause the control circuit to output a turn-off control signal, to control the power semiconductor switch in each of the power module to be turned off.

According to an embodiment of the present disclosure, when the contact of the temperature switch of at least one of the temperature protection branches is closed, the secondary winding of the isolation transformer of the temperature protection branch is configured to output a temperature protection signal to the control circuit, and the control circuit is configured to output a turned-off control signal to control the power semiconductor switch in each of the power module to be turned off.

According to an embodiment of the present disclosure, the power module is one of a full-bridge converter, a half-bridge converter, a neutral point clamped three-level converter, a diode clamped three-level converter, a flying capacitor three-level converter, a full-bridge resonant converter, and a half-bridge resonant converter.

According to an embodiment of the present disclosure, the voltage source of each of the temperature protection branches includes a Zener diode and a capacitor connected in parallel, a cathode of the Zener diode is coupled to a first end of the capacitor and a second end of the resistor, an anode of the Zener diode is coupled to a second end of the capacitor and the potential midpoint of the power converter.

The temperature protection circuit for the power converter of the embodiment of the present disclosure has a simple structure of a circuit, a voltage source, an isolation transformer, a temperature switch. The circuit structure has a low cost. The temperature switch withstanding a low voltage could be used. Since there is no problem of withstanding voltage for the temperature switch, the reliability can be high and the temperature switch can work for a long time.

BRIEF DESCRIPTION OF THE DRAWINGS

The above and other features and advantages of the present disclosure will become more apparent from the detailed description.

DETAILED DESCRIPTION

Figure 1:
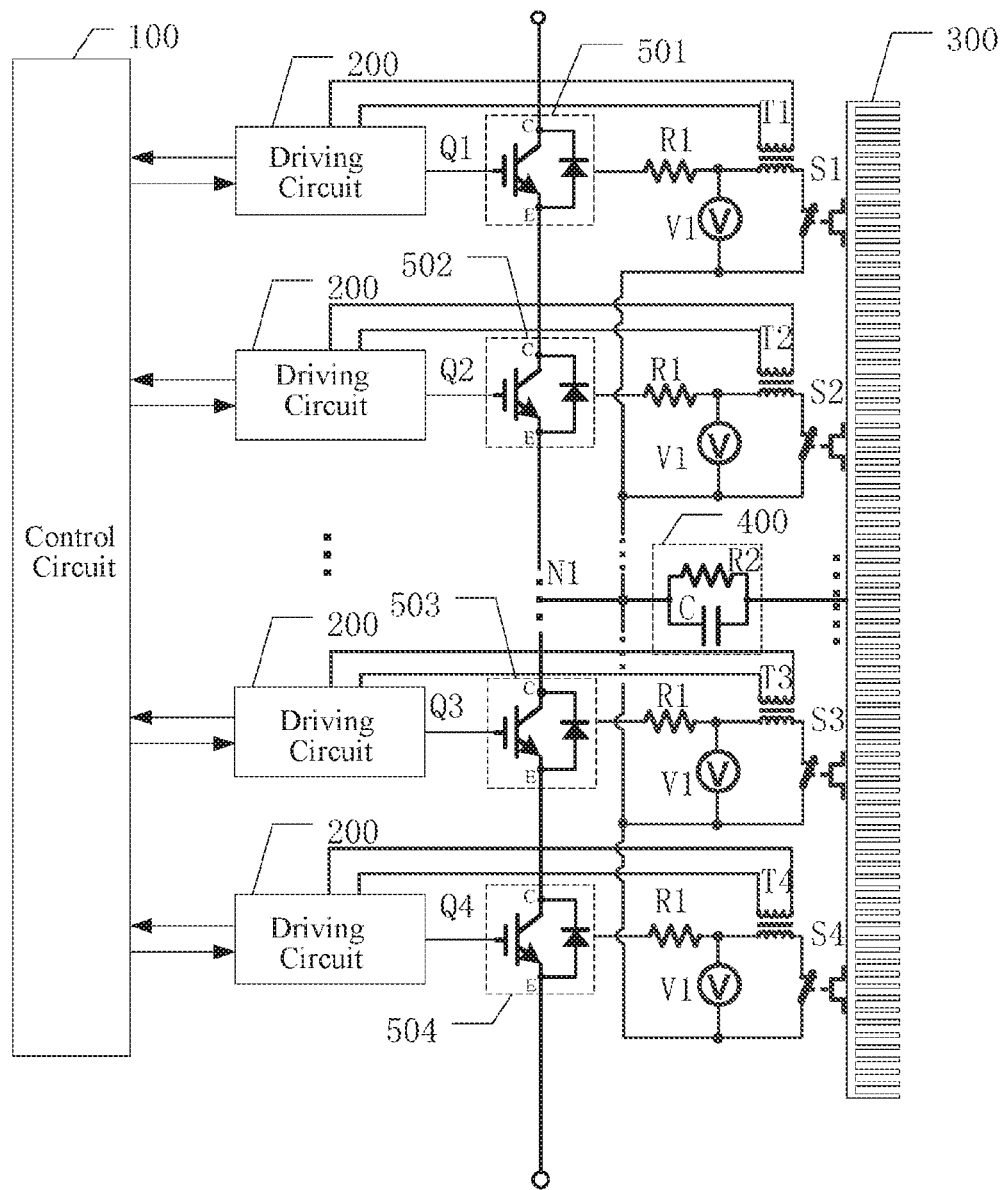
FIG. 1 is a diagram showing the structure of a power converter and its temperature protection circuit according to an embodiment of the present disclosure.

Exemplary embodiments will now be described more fully with reference to the accompanying drawings. However, the exemplary embodiments can be embodied in a variety of forms, and should not be construed as being limited to the embodiments set forth herein. Rather, these embodiments are provided so that the present disclosure will be thorough and complete, and the concept of the exemplar) embodiments can be fully conveyed to those skilled in the art. In the drawings, the size of the components may be exaggerated or modified for clarity. The same reference numerals in the drawings denote the same or similar structures, and thus their detailed description will be omitted.

In addition, as used herein, "coupled" may mean that two or more elements are in direct physical or electrical contact with each other, or in indirectly physical or electrical contact with each other, or that two or more elements are operative or acting to each other.

Furthermore, the described features, structures, or characteristics may be combined in any suitable manner in one or more embodiments. In the following description, numerous specific details are set forth to provide a full understanding of the embodiments of the present disclosure. However, those skilled in the art will appreciate that the technical solution of the present disclosure may be practiced without one or more of the specific details, or other methods, elements, and the like may be employed. In other instances, well-known structures, methods, or operations are not shown or described in detail to avoid obscuring aspects of the present disclosure.

FIG. 1 illustrates the structure of a power converter and corresponding temperature protection circuit according to an embodiment of the present disclosure. The power converter includes a control circuit 100, a plurality of driving circuits 200, a plurality of power semiconductor switch blocks 501 to 504 connected in series corresponding to the driving circuit 200 and a heat sink 300. It should be noted that the plurality of power semiconductor switch blocks 501 to 504 share one heat sink 300. In the example of FIG. 1, each power semiconductor switch block includes a power semiconductor switch. For example, the power semiconductor switch blocks 501 to 504 include power semiconductor switches Q1 to Q4, respectively. The power semiconductor switches are power devices such as, but not limited to, IGBTs. The control circuit 100 outputs control signals to the plurality of driving circuits 200, and each of the driving circuits 200 outputs a driving signal to the corresponding power semiconductor switch block 501 to 504 based on the received control signal, to drive the power semiconductor switch Q1 to Q4 to be turned on or turned off. The power converter further includes a voltage-withstanding clamping circuit 400 composed of a resistor R2 and a capacitor C connected in parallel. The voltage-withstanding clamping circuit 400 is connected between a potential midpoint N1 of the power converter and the heat sink 300, for maintaining the potential of the heat sink 300 around a voltage of the potential midpoint N1.

In the case of the temperature protection circuit of FIG. 1, each power semiconductor switch block corresponds to one temperature protection branch. Each temperature protection branch includes a resistor R1, a voltage source V1, a temperature switch S1, and a transformer T1. Each of the temperature switches S1-S4 includes a contact of the temperature switch and a base. The base is disposed on the heat sink 300. Taking the power semiconductor switch block 501 and its corresponding temperature protection branch as an example, the resistor R1 has a first end coupled to an output electrode of the power semiconductor switch block 501, and a second end coupled to a first end of the voltage source V1 and a first end of the contact of the temperature switch S1 via a primary winding of the isolation transformer T1. A second end of the voltage source V1 and a second end of the contact of the temperature switch S1 are respectively coupled to the potential midpoint N1 of the power converter. Two ends of a secondary winding of the isolation transformer T1 are respectively coupled to the driving circuit 200 corresponding to the corresponding power semiconductor switch block 501. The output electrode of the power semiconductor switch block 501 is the collector or the emitter of Q1.

The structures of the temperature protection branches of the power semiconductor switch blocks 502 to 504 are similar to the temperature protection branch corresponding to the power semiconductor switch block 501.

The setting of the potential midpoint N1 of the power converter will now be described. It is assumed that the power converter includes N power semiconductor switch blocks, where N is a natural number.

When N is an odd number, the power semiconductor switch block at the middle position in the power semiconductor switch blocks connected in series in the power converter is the $((N+1)/2)^{th}$ power semiconductor switch block. The potential midpoint N1 of the power converter is set at the connection point between the power semiconductor switch block at the middle position and the previous power semiconductor switch block connected in series, that is, the connection point between the $((N-1)/2)^{th}$ power semiconductor switch block and the $((N+1)/2)^{th}$ power semiconductor switch block of the power converter. Alternatively, the potential midpoint N1 of the power converter is set at the connection point between the power semiconductor switch block at the middle position and the next power semiconductor switch block connected in series, that is, the connection point between the $((N+1)/2)^{th}$ power semiconductor switch block and the $((N+3)/2)^{th}$ power semiconductor switch block of the power converter.

When N is an even number, the potential midpoint N1 of the power converter is set as a connection point between the $(N/2)^{th}$ power semiconductor switch block and the $(N/2+1)^{th}$ power semiconductor switch block.

Taking the power semiconductor switch block 501 and its corresponding temperature protection branch as an example, when the power semiconductor switch Q1 in the power semiconductor switch block 501 on the heat sink 300 performs a switching operation, that is, the power semiconductor switch Q1 is turned on or off, there is a potential difference between the two ends of the temperature protection branch corresponding to the power semiconductor switch block 501 in the temperature protection circuit, that is, a potential difference between the output electrode (the collector or the emitter) of the power semiconductor switch Q1 and the heat sink 300. Therefore, it is possible to make the voltage source V1 to have a preset voltage through the resistor R1. The magnitude of the preset voltage is determined depending on actual demand, and a corresponding device is selected according to actual demand, in order to reach the preset voltage. In this embodiment, when the temperature sensed by the temperature switch S1 reaches the protection point, the contact of the temperature switch S1 is closed, and the temperature protection branch transmits a temperature protection signal (which may be a pulse signal) to the corresponding driving circuit 200 via the isolation transformer T1. The corresponding driving circuit 200 outputs a turn-off driving signal such that the power semiconductor switch Q1 in the power semiconductor switch block 501 corresponding is turned off. Further, the driving circuit 200 may also transmit the received temperature protection signal to the control circuit 100, and a turn-off control signal is output through the control circuit 100, to control all of the power semiconductor switches Q1 to Q4 in the power semiconductor switch blocks 502 to 504 to be turned off. Specifically, the control circuit 100 outputs a turn-off control signal to each of the driving circuits 200. Then, each of the driving circuits generates a turn-off driving signal according to the turn-off control signal, to drive all of the power semiconductor switches Q1 to Q4 in the power semiconductor switch blocks 502 to 504 to be turned off.

In this process, the outer casing of the temperature switch S1 is at an equal potential to that of the heat sink 300, and the maximum potential difference between the contact of the temperature switch S1 and the heat sink 300 is the voltage of the voltage source V1. Therefore, the maximum potential difference between the contact and the outer casing of the temperature switch S1 is only the voltage of the voltage source V1 rather than the sum of the voltages of the plurality of power semiconductor blocks connected in series. Since the voltage of the voltage source V1 is relatively low, the temperature switch S1 only withstand a low voltage. When the temperature sensed by any one of the temperature switches S1-S4 reaches the protection point, the contact of the corresponding temperature switch is closed, and the corresponding temperature protection branch transmits the temperature protection signal to the corresponding driving circuit 200 through the isolation transformer T1. The driving circuit 200 outputs a turn-off driving signal according to the received temperature protection signal, to drive the power semiconductor switch in the corresponding power semiconductor switch block to be turned off. Further, the driving circuit 200 may also transmit the received temperature protection signal to the control circuit 100, and the control circuit 100 outputs a turn-off control signal to control all of the power semiconductor switches in the power semiconductor switch blocks to be turned off. Specifically, the control circuit 100 outputs a turn-off control signal to each of the driving circuits 200. Then, each of the driving circuits generates a turn-off driving signal according to the turn-off control signal, to drive all of the power semiconductor switches in the power semiconductor switch blocks to be turned off.

In other embodiments, when the temperatures sensed by the plurality of temperature switches S1-S4 reach the protection point, the contacts of the corresponding temperature switches are closed, and the corresponding temperature protection branches transmit the temperature protection signals through the isolation transformer to the corresponding driving circuits 200. The driving circuits 200 outputs turn-off driving signals according to the received temperature protection signals to turn off the power semiconductor switches in the corresponding power semiconductor switch blocks. Further, the driving circuits 200 may also transmit the received temperature protection signal to the control circuit 100, and the control circuit outputs a turn-off control signal to control all of the power semiconductor switches in the power semiconductor switch blocks to be turned off.

Figure 2:
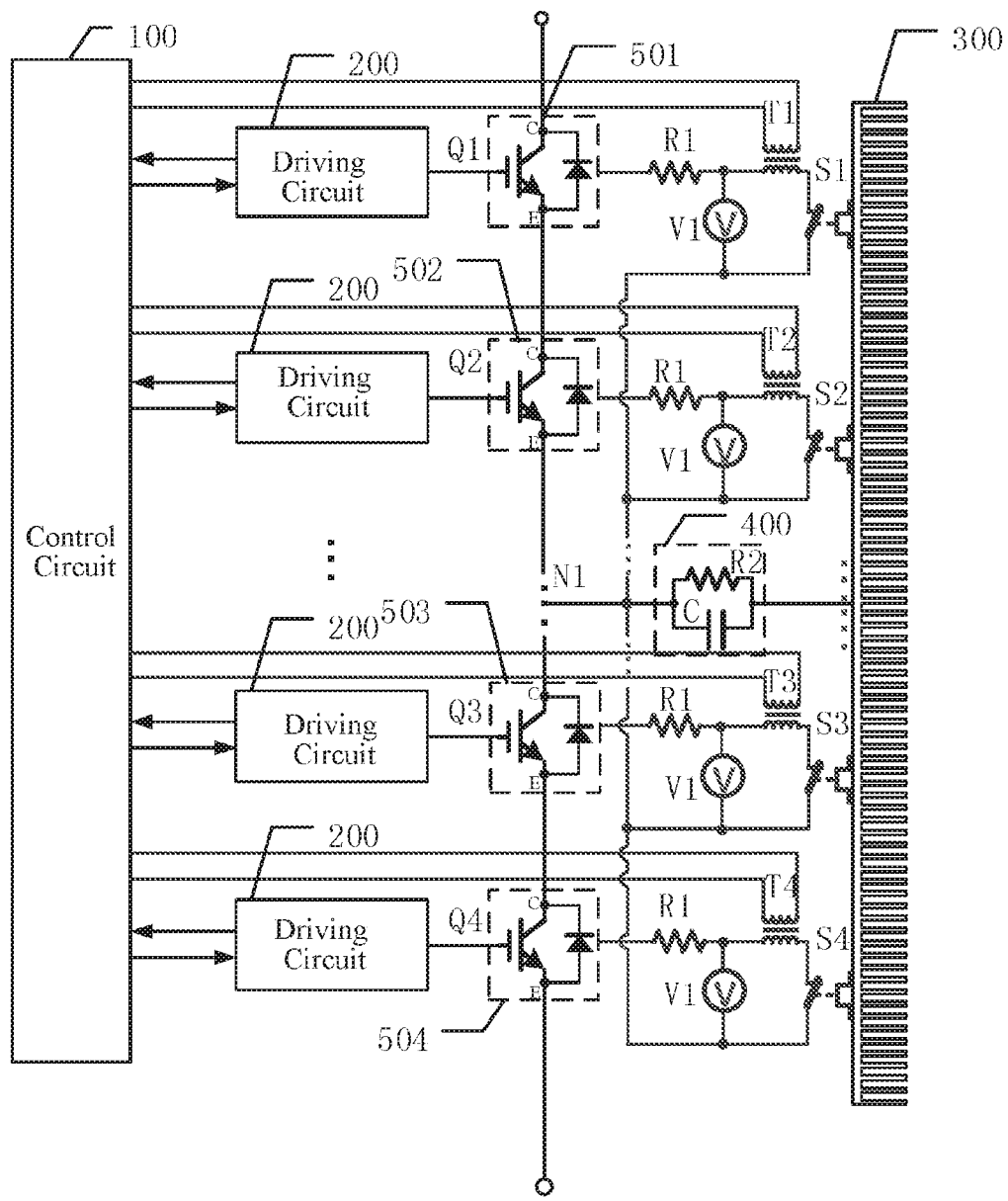
FIG. 2 is a diagram showing the structure of a power converter and its temperature protection circuit according to another embodiment of the present disclosure.

FIG. 2 illustrates another power converter and its corresponding temperature protection circuit according to an embodiment of the present disclosure. The difference from FIG. 1 lies in that the two ends of the secondary winding of the isolation transformer of the temperature protection branch corresponding to each power semiconductor switch block in FIG. 2 are respectively coupled to the control circuit 100. Therefore, when temperature sensed by any one or more of the temperature switches S1 to S4 reach the protection point, the contact of the corresponding temperature switch is closed, and the temperature protection branch transmits the temperature protection signal to the control circuit 100 through the isolation transformer. The control circuit 100 outputs a turn-off control signal such that all of the power semiconductor switches Q1 to Q4 in the power semiconductor switch blocks 501 to 504 are turned off.

Figure 3:
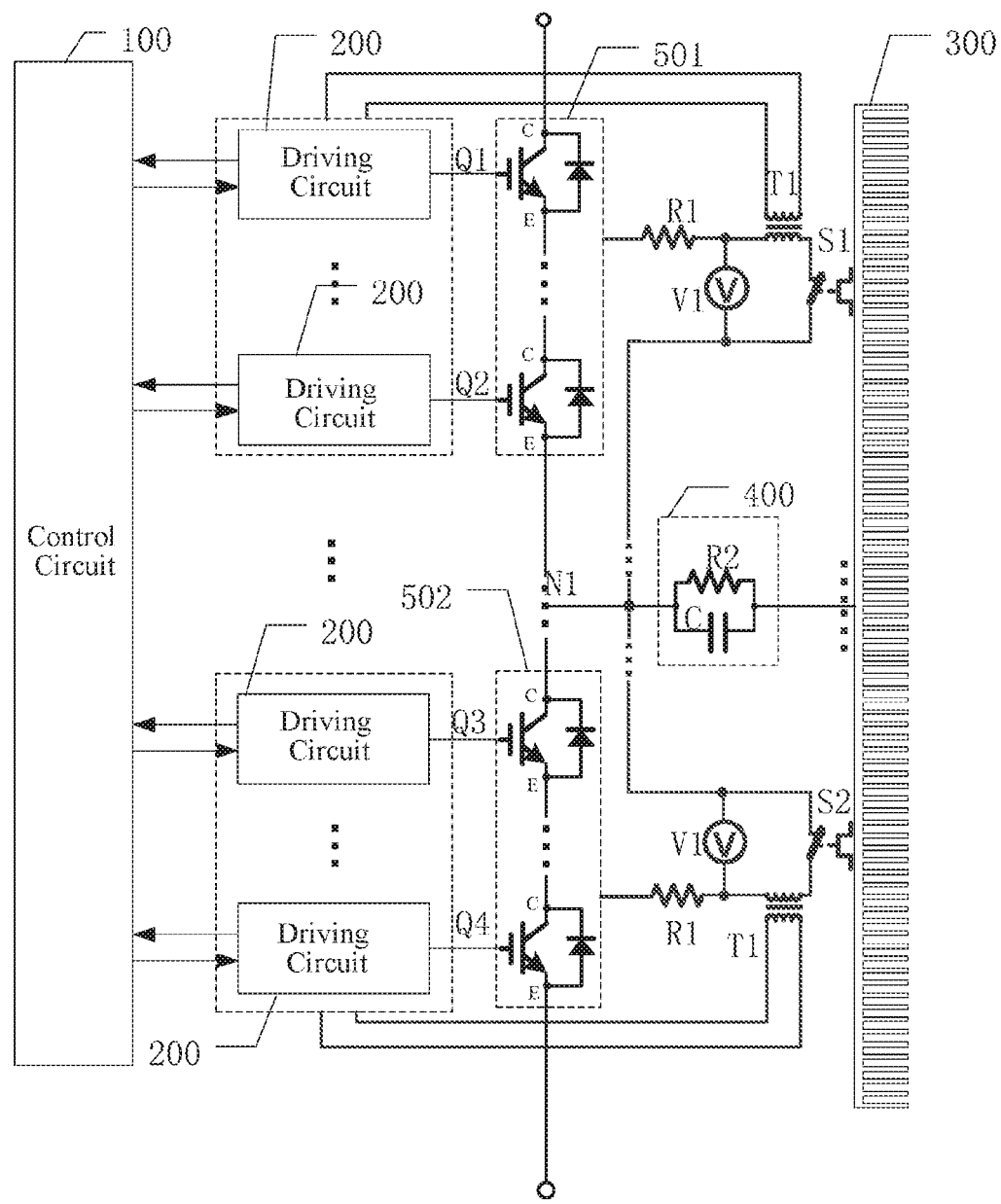
FIG. 3 is a diagram showing the structure of a power converter and its temperature protection circuit according to still another embodiment of the present disclosure.
Figure 4:
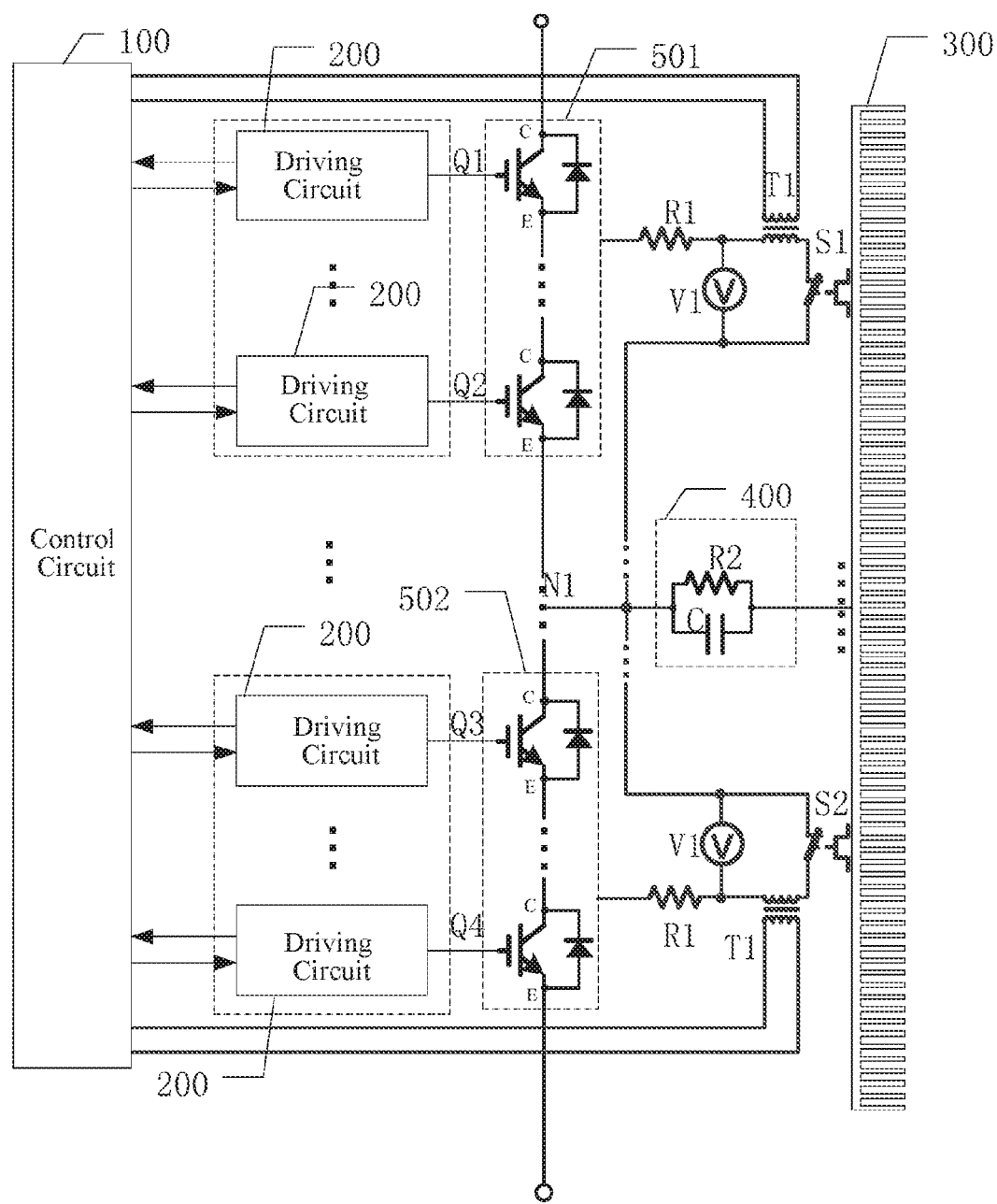
FIG. 4 is a diagram showing the structure of a power converter and its temperature protection circuit according to still another embodiment of the present disclosure.

FIGS. 3 and 4 further illustrate a power converter and its corresponding temperature protection circuit according to an embodiment of the present disclosure, in which each power semiconductor switch block has a plurality of power semiconductor switches, i.e., a plurality of power semiconductor switches corresponding to one temperature protection branch.

In the structure shown in FIG. 3, each of the power semiconductor switches Q1 and Q2 in the power semiconductor switch block 501 has a corresponding driving circuit 200. Compared with the temperature protection circuit of FIG. 1, in the temperature protection branch corresponding to the power semiconductor switch block 501, two ends of the secondary winding of the isolation transformer T1 are respectively coupled to the two driving circuits 200 corresponding to the power semiconductor switches Q1 and Q2 in the corresponding power semiconductor switch block 501. The corresponding circuit structure of the power semiconductor switch block 502 is similar to 501.

For the output electrode of the power semiconductor switch block 501, the collector or the emitter of any of the power semiconductor switches Q1 and Q2 in the power semiconductor switch block 501 can be selected. The output electrode of power semiconductor switch block 502 may be selected in a way similar to that for the power semiconductor switch block 501. When the power semiconductor switches in the power semiconductor switch block 501 are turned on or off, there is a voltage difference between the output electrode and the heat sink.

The setting of the voltage of the potential midpoint N1 in FIG. 3 is similar to that of FIG. 1.

When one or two of the temperatures sensed by the temperature switches S1-S2 reach the protection point, the contacts of the corresponding temperature switches are closed. Taking the temperature switch S1 as an example, when the temperature sensed by the temperature switch S1 reaches the protection point, the contact of the temperature switch S1 is closed, the temperature protection branch transmits a temperature protection signal to the corresponding two driving circuits 200 through the isolation transformer T1. The two driving circuits 200 respectively output a turn-off driving signal, to drive the power semiconductor switches Q1 and Q2 in the power semiconductor switch block 501 to be turned off. Further, the driving circuit 200 may also transmit the received temperature protection signal to the control circuit, and then a turn-off control signal is output through the control circuit 100, to control all of the power semiconductor switches Q1 to Q4 in the power semiconductor switch blocks 501 to 502 to be turned off. Specifically, the control circuit 100 outputs a turn-off control signal, and the control circuit 100 outputs a turn-off control signal to each of the driving circuits 200. Each of the driving circuits 200 generates a turn-off driving signal according to the turn-off control signal, to drive each of the power semiconductor switches Q1 to Q4 in all of the power semiconductor switch blocks 501 to 502 to be turned off.

The circuit structure shown in FIG. 4 is different from that of FIG. 3 in that both ends of the secondary winding of the isolation transformer T1 of the temperature protection branch corresponding to each power semiconductor switch block in FIG. 4 are respectively coupled to the control circuit 100. Therefore, when one or two temperatures sensed by the temperature switches S1-S2 reach the protection point, the contact of the temperature switches S1 and/or S2 is closed, and the temperature protection branch transmits the temperature protection pulse signal to the control circuit 100 through the isolation transformer. The control circuit 100 outputs a turn-off control signal, to control all of the power semiconductor switches Q1 to Q4 in the power semiconductor switch blocks 501 to 502 to be turned off.

FIGS. 5 to 8 illustrate the structure of a power converter and its corresponding temperature protection circuit according to another embodiment of the present disclosure.

Figure 5:
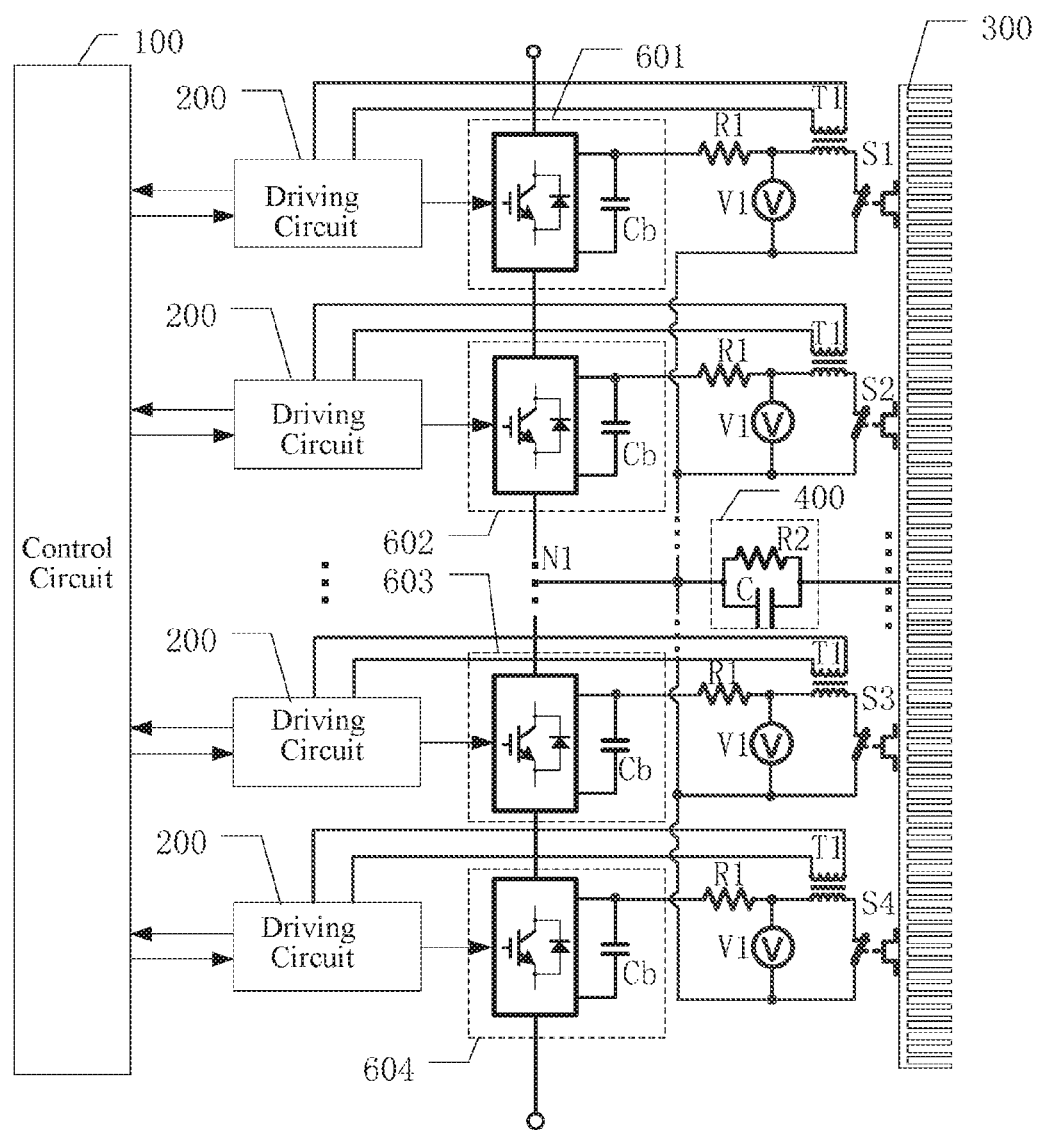
FIG. 5 is a diagram showing the structure of a power converter and its temperature protection circuit according to an embodiment of the present disclosure.

In FIG. 5, the power converter includes a control circuit 100, a plurality of driving circuits 200, a plurality of power module blocks 601 to 604 connected in cascade corresponding to the driving circuit 200 and a heat sink 300. The power modules 601 to 604 share one heat sink 300. Each power module block includes at least one power module, and the power module may be one of a full-bridge converter, a half-bridge converter, a neutral point clamped three-level converter, a diode clamped three-level converter, a flying capacitor three-level converter, a full-bridge resonant converter, and a half-bridge resonant converter. In the example of FIG. 5, each power module block includes one power module. The control circuit 100 outputs control signals to the plurality of driving circuits 200, and each of the driving circuits 200 outputs driving signals to the power semiconductor switches in the corresponding power module blocks 601 to 604 based on the received control signals, to drive the power semiconductor switches in the power module to be turned on or off. The power converter further includes a voltage-withstanding clamping circuit 400 composed of a resistor R2 and a capacitor C connected in parallel. The voltage-withstanding clamping circuit 400 is connected between a potential midpoint N1 of the power converter and the heat sink 300, for maintaining the potential of the heat sink 300 at the midpoint of the potential.

In the case of the temperature protection circuit of FIG. 5, each power module block corresponds to one temperature protection branch. Each temperature protection branch includes a resistor R1, a voltage source V1, a temperature switch S1, and a transformer T1. Each of the temperature switches S1-S4 includes a contact of the temperature switch and a base. The base is disposed on the heat sink 300. Taking the first power module block 601 and its temperature protection branch as an example, the resistor R1 has a first end coupled to a DC terminal of the power module block 601, and a second end coupled to a first end of the voltage source V1 and a first end of the contact of the temperature switch S1 via a primary winding of the isolation transformer T1. A second end of the voltage source V1 and a second end of the contact of the temperature switch S1 are respectively coupled to the potential midpoint N1 of the power converter. Two ends of a secondary winding of the isolation transformer T1 are respectively coupled to the driving circuit 200 corresponding to the corresponding power module block 601.

The power module block 601 includes a power module including a DC bus capacitor Cb, and the DC terminal of the power module block 601 is a positive terminal or a negative terminal of the DC bus capacitor Cb.

The structures of the temperature protection branches corresponding to the power module blocks 602 to 604 are similar to the temperature protection branch corresponding to the power module block 601.

The setting of the potential midpoint N1 of the power converter will now be described. It is assumed that the power converter includes N power module blocks, where N is a natural number.

When N is an odd number, the power module block at the middle position in the power module blocks connected in cascade in the power converter is the $((N+1)/2)^{th}$ power module block. The potential midpoint N1 of the power converter is set at the connection point between the power module block at the middle position and the previous power module block, that is, the connection point between the $((N-1)/2)^{th}$ power module block and the $((N+1)/2)^{th}$ power module block of the power converter. Alternatively, the potential midpoint N1 of the power converter is set at the connection point between the power module block at the middle position and the next power module block, that is, the connection point between the $((N+1)/2)^{th}$ power module block and the $((N+3)/2)^{th}$ power module block of the power converter.

When N is an even number, the potential midpoint of the power converter is a connection point between the $(N/2)^{th}$ power module block and the $(N/2+1)^{th}$ power module block.

Taking the power module block 601 and its corresponding temperature protection branch as an example, when the power semiconductor switches of the power module in the power module block 601 on the heat sink 300 performs switching operation, that is, the power semiconductor switches are turned on or off, there is a potential difference between the two ends of the temperature protection branch corresponding to the power module block 601 in the temperature protection circuit, that is, a potential difference between the DC terminal and the heat sink 300. Therefore, it is possible to make the voltage source V1 to have a preset voltage through the resistor R1. When the temperature sensed by the temperature switch S1 reaches the protection point, the contact of the temperature switch S1 is closed, and the temperature protection branch transmits a temperature protection signal to the corresponding driving circuit 200 via the isolation transformer T1. The driving circuit 200 outputs turn-off driving signals to drive the power semiconductor switch of the power module in the power module block 601 to be turned off. Further, the driving circuit 200 may also transmit the received temperature protection signal to the control circuit 100, and a turn-off control signal is output through the control circuit 100, to control all of the power semiconductor switches of the power modules in the power module blocks 602 to 604 to be turned off.

In this process, the outer casing of the temperature switch S1 is at an equal potential to that of the heat sink 300, and the maximum potential difference between the contact of the temperature switch S1 and the heat sink 300 is the voltage of the voltage source V1. Therefore, the maximum potential difference between the contact and the outer casing of the temperature switch S1 is only the voltage of the voltage source V1 rather than the sum of the voltages of the plurality of power semiconductor blocks connected in cascade. Since the voltage of the voltage source V1 is relatively low, the temperature switch S1 only has only to withstand a low voltage.

The operating principles of the other power module blocks 602 to 604 are similar to that of the power module block 601.

In other embodiments, when the temperatures sensed by the plurality of temperature switches S1-S4 reach the protection point, the contacts of the corresponding temperature switches are closed, and the corresponding temperature protection branches transmit the temperature protection signals through the isolation transformer T1 to the corresponding driving circuits 200. The driving circuits 200 outputs turn-off driving signals according to the received temperature protection signals to drive the power semiconductor switches of the power modules in the corresponding power module blocks to be turned off. Further, the driving circuits 200 may also transmit the received temperature protection signal to the control circuit 100, and the control circuit outputs a turn-off control signal to control all of the power semiconductor switches of the power modules in the power module blocks to be turned off.

Figure 6:
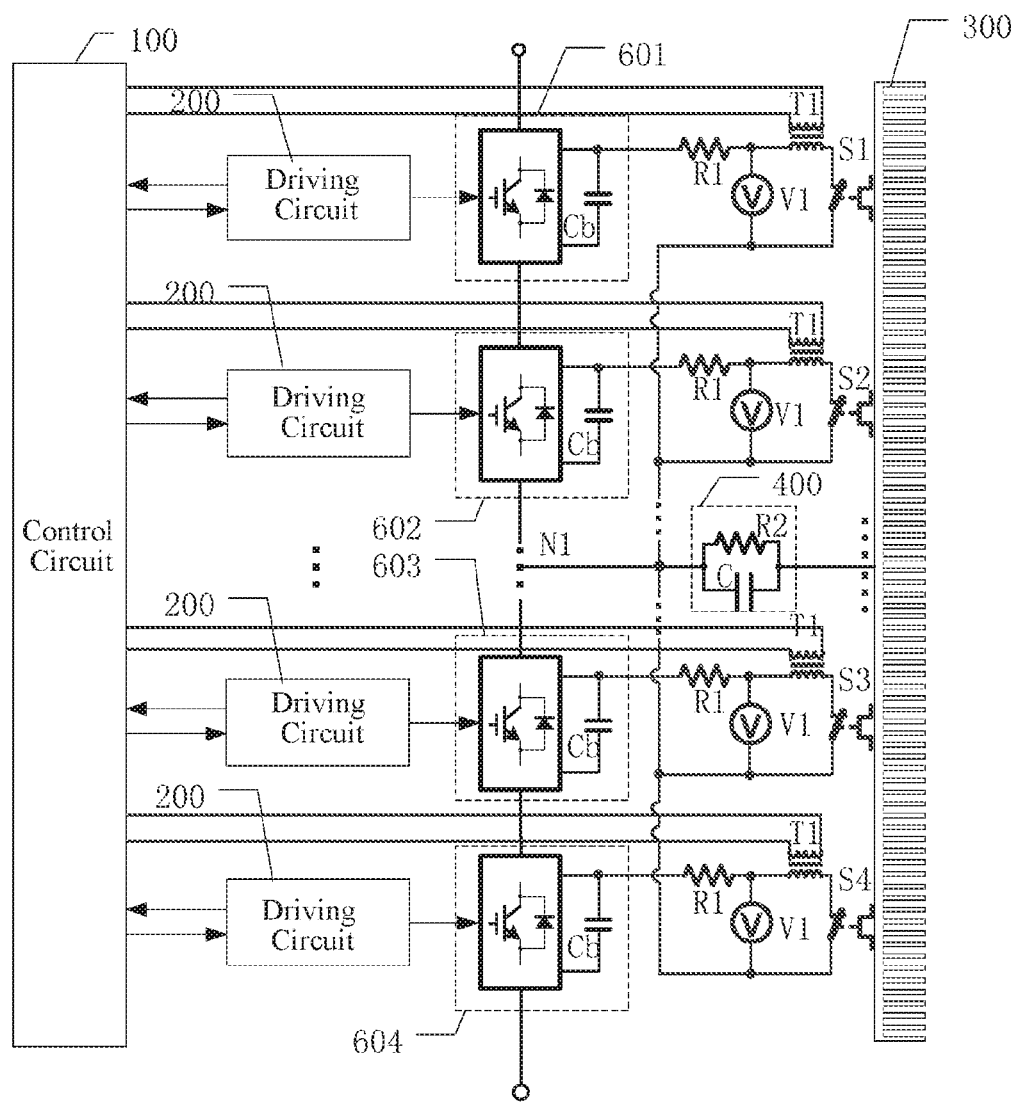
FIG. 6 is a diagram showing the structure of a power converter and its temperature protection circuit according to another embodiment of the present disclosure.

FIG. 6 illustrates another power converter and its corresponding temperature protection circuit according to an embodiment of the present disclosure. The difference from FIG. 5 lies in that the two ends of the secondary winding of the isolation transformer T1 of the temperature protection branch corresponding to each power module block in FIG. 6 are respectively coupled to the control circuit 100. Therefore, when temperature sensed by one or more of the temperature switches S1 to S4 reaches the protection point, the contact of the corresponding temperature switch is closed, and the temperature protection branch transmits the temperature protection signal to the control circuit 100 through the isolation transformer T1. The control circuit 100 outputs a turn-off control signal, to control all of the power semiconductor switches of the power modules in the power module blocks 601 to 604 to be turned off.

Figure 7:
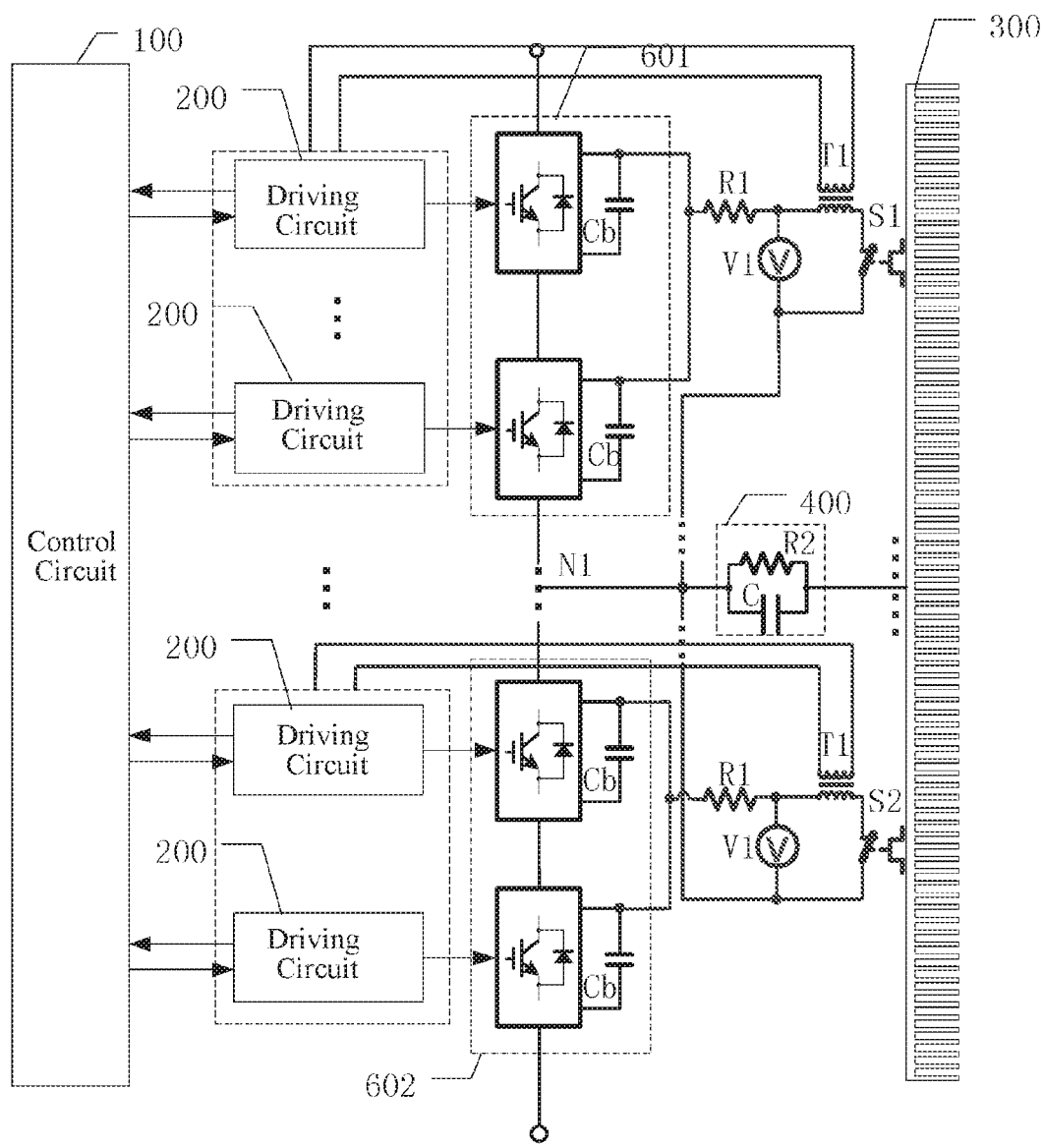
FIG. 7 is a diagram showing the structure of a power converter and its temperature protection circuit according to still another embodiment of the present disclosure.
Figure 8:
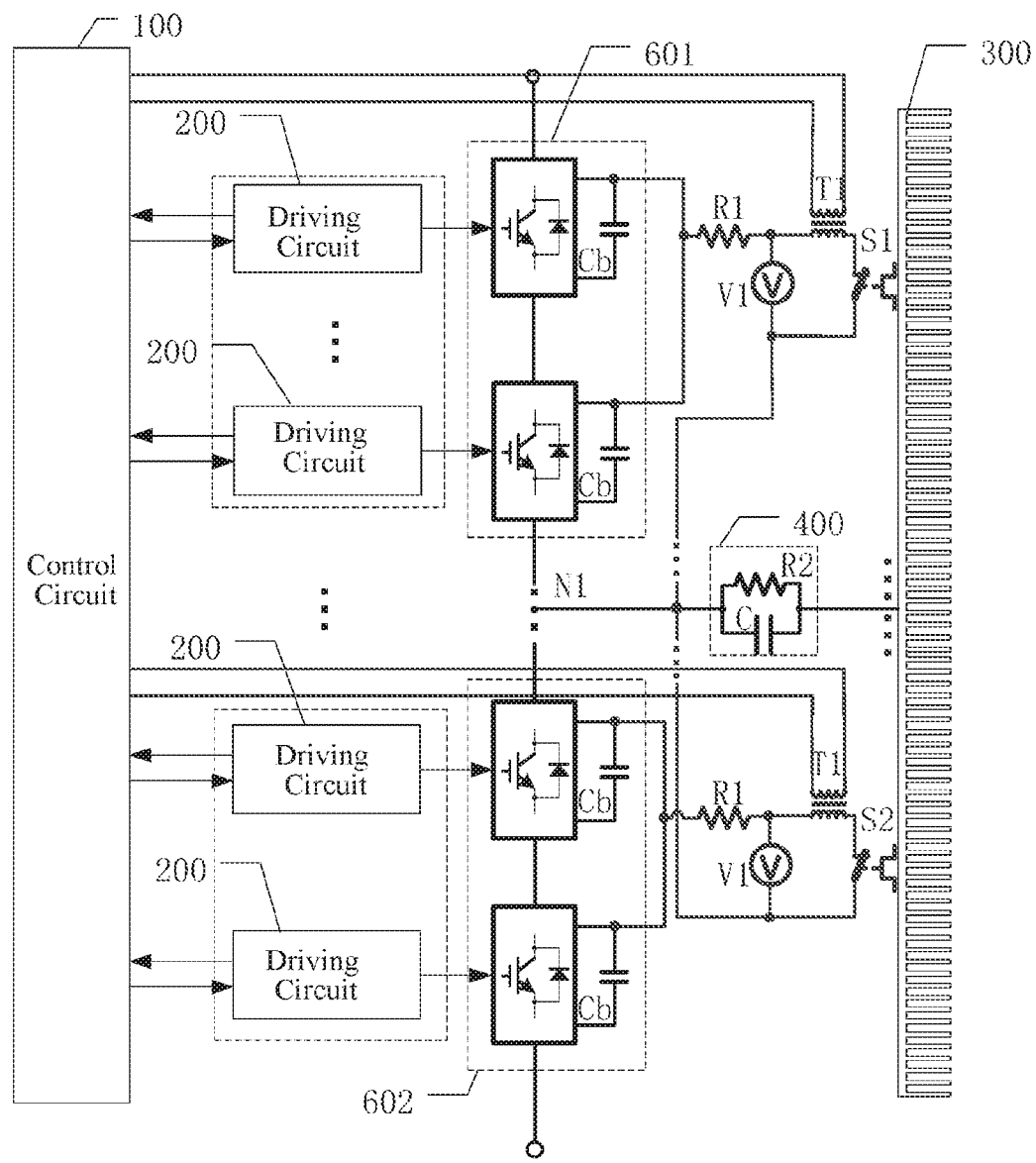
FIG. 8 is a diagram showing the structure of a power converter and its temperature protection circuit according to still another embodiment of the present disclosure.

FIGS. 7 and 8 further illustrate a power converter and its corresponding temperature protection circuit according to an embodiment of the present disclosure, in which each power module block has a plurality of power modules, i.e., a plurality of power modules corresponding to one temperature protection branch.

In the structure shown in FIG. 7, each of the power modules in the power module block 601 has a corresponding driving circuit 200, to respectively turn on or off the power semiconductor switch of the power module through a driving signal. In this case, compared with the temperature protection circuit of FIG. 5, in the temperature protection branch of the temperature control circuit corresponding to the power module block 601, two ends of the secondary winding of the isolation transformer T1 are respectively coupled to the two driving circuits 200 corresponding to the power modules in the corresponding power module block 601. The corresponding circuit structure of the power module block 602 is similar to that of the power module block 601.

For the DC terminal of the power module block 601, each power module includes a DC bus capacitor Cb. The positive terminal or negative terminal of the DC bus capacitor Cb of any one of the power modules in the power module block 601 can be selected as the DC terminal of the power module block 601. The DC terminal of power module block 602 may be selected in a way similar to that for the power module block 601. When the power semiconductor switches of the power modules in the power module block 601 are turned on or off, there is a voltage difference between the DC terminal and the heat sink.

The setting of the voltage of the potential midpoint N1 in FIG. 7 is similar to that of FIG. 5.

When the temperature sensed by one or two of the temperature switches S1-S2 reaches the protection point, the contact of the temperature switch S1 and/or S2 is closed, the temperature protection branch transmits a temperature protection signal to the corresponding two driving circuits 200 through the isolation transformer T1. The two driving circuits output turn-off driving signals, to make the power semiconductor switches of the power modules in the power module block 601 to be turned off. Further, the driving circuit 200 may also transmit the received temperature protection signal to the control circuit 10, and the control circuit 10 outputs a turn-off control signal to control all of the power semiconductor switches of the power modules in the power module blocks to be turned off.

The circuit structure shown in FIG. 8 is different from that of FIG. 6 in that both ends of the secondary winding of the isolation transformer T1 of the temperature protection branch corresponding to each power module block in FIG. 8 are respectively coupled to the control circuit 100. Therefore, when the temperature sensed by the temperature switches S1 and/or S2 reaches the protection point, the contact of the temperature switches S1 and/or S2 is closed, and the temperature protection branch transmits the temperature protection signal to the control circuit 100 through the isolation transformer T1. The control circuit 100 outputs a turn-off control signal, to control all of the power semiconductor switches of the power modules in the power module blocks 601 to 602 to be turned off.

Figure 9:
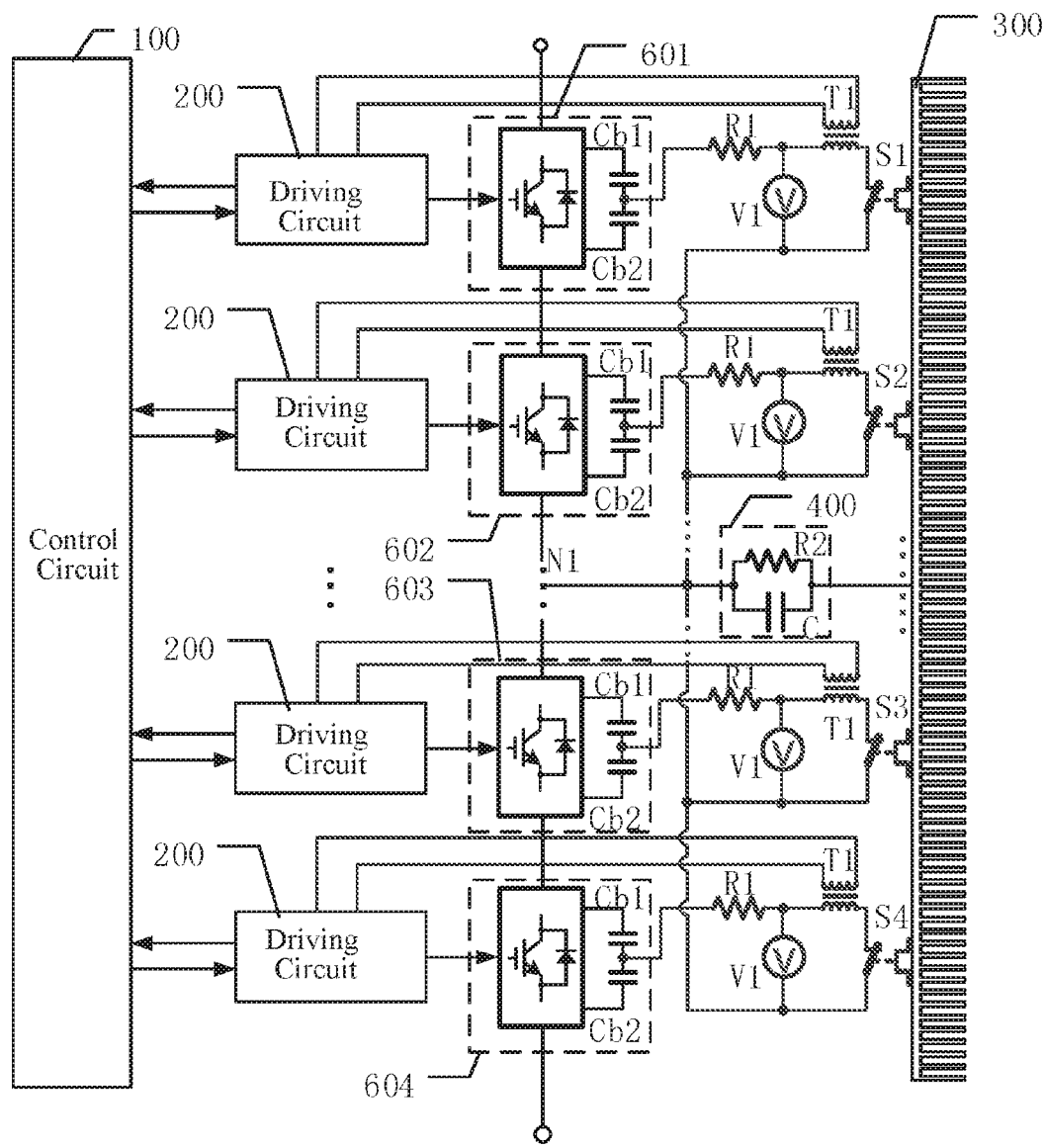
FIG. 9 is a diagram showing the structure of a power converter and its temperature protection circuit according to still another embodiment of the present disclosure.
Figure 10:
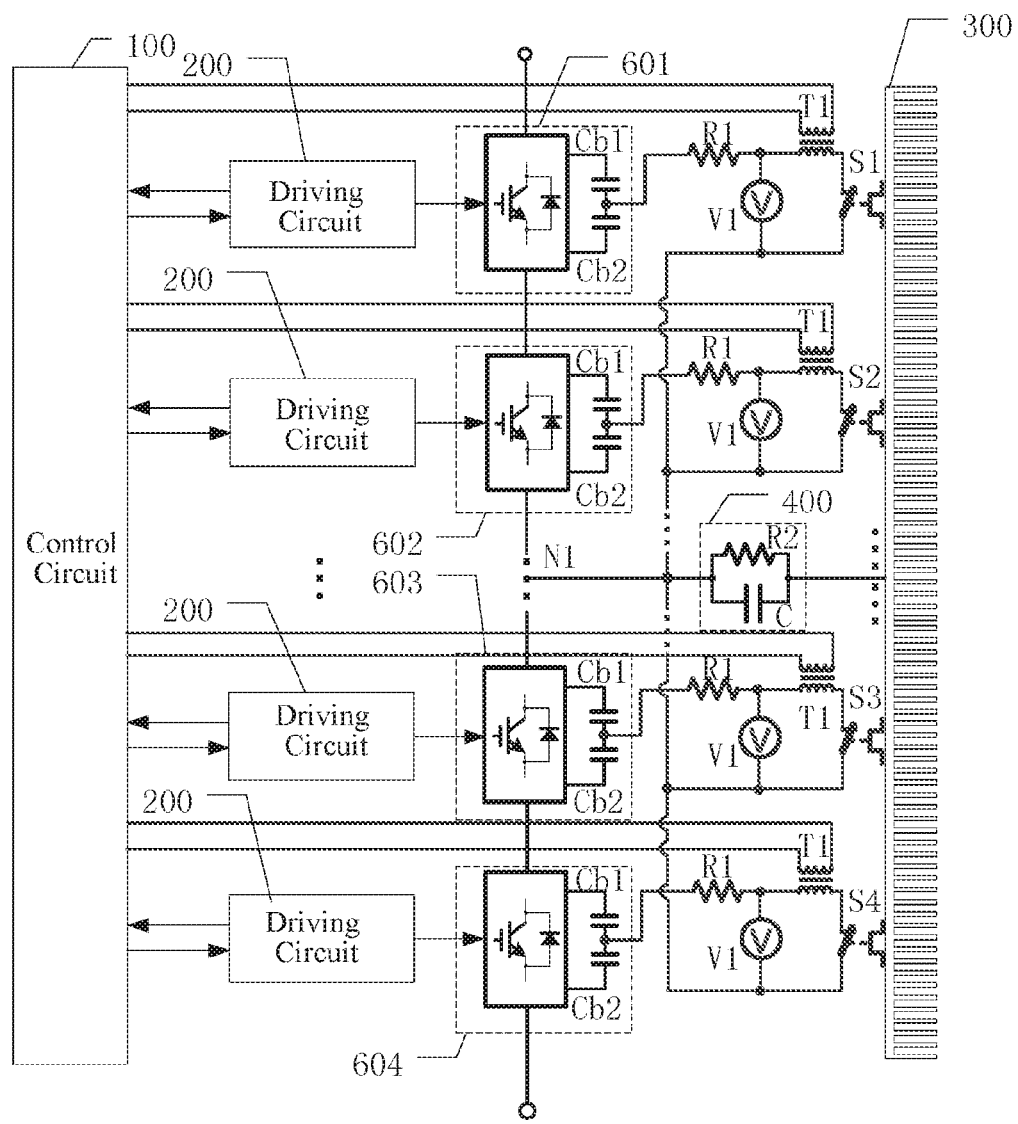
FIG. 10 is a diagram showing the structure of a power converter and its temperature protection circuit according to still another embodiment of the present disclosure.

FIGS. 9 and 10 respectively show the case where each power module of FIGS. 5 and 6 includes a DC bus capacitor block as described above.

Compared with FIG. 5, the power module in FIG. 9 includes a DC bus capacitor block, and the DC bus capacitor block includes two DC bus capacitors Cb1 and Cb2 connected in series, and the DC terminal of the power module block 601 is the positive terminal or the negative terminal of the DC bus capacitor block or a connection point of the two DC bus capacitors Cb1 and Cb2. Compared with FIG. 6, in FIG. 10, each power module includes a DC bus capacitor block, and the DC bus capacitor block includes two DC bus capacitors Cb1 and Cb2 connected in series. The DC terminal of the power module block 601 is the positive terminal or the negative terminal of the DC bus capacitor block of any power module or a connection point of the two DC bus capacitors Cb1 and Cb2. Other settings are similar to those of FIGS. 5 and 6.

It should be understood that the implementation of including a DC bus capacitor block is also applicable to the power module block having a plurality of power modules in FIGS. 7 and 8.

Figure 11:
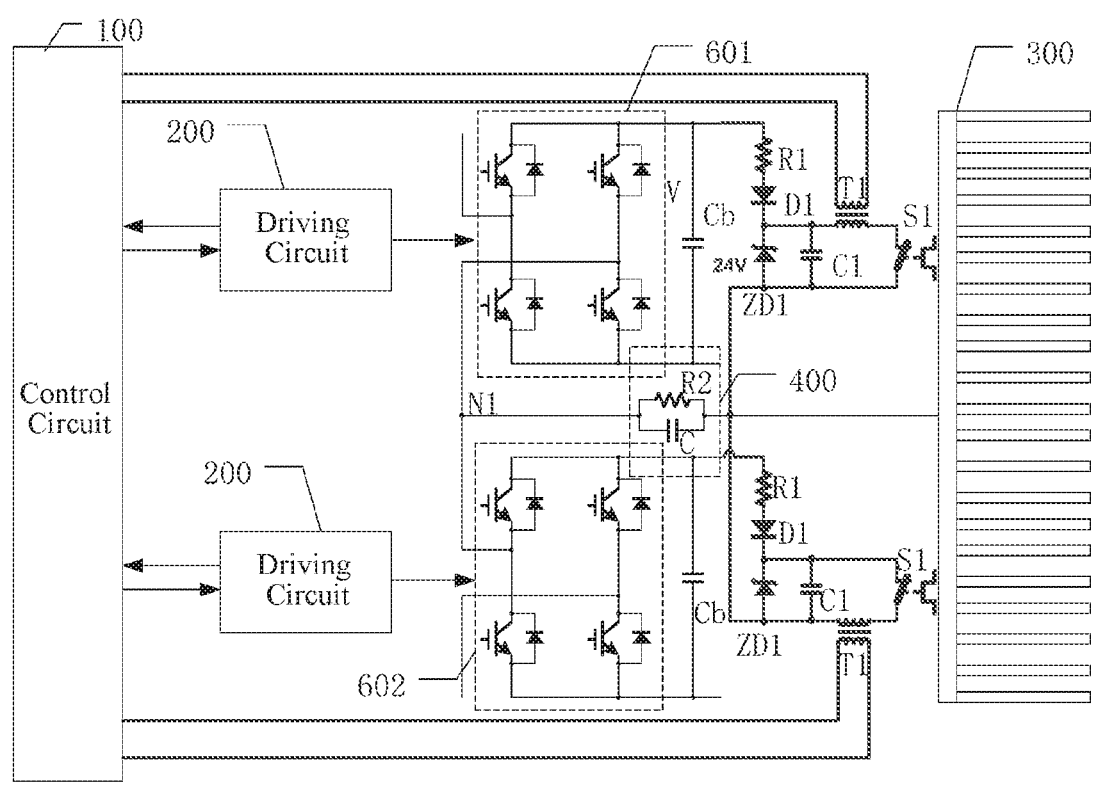
FIG. 11 is a diagram showing the structure of a power converter and its temperature protection circuit according to an embodiment of the present disclosure.

FIG. 11 illustrates a power converter and its corresponding temperature protection circuit according to an embodiment of the present disclosure. Compared with FIG. 6, the power module block 601 in FIG. 11 includes a power module composed of a full-bridge converter. Power module blocks 601 and 602 connect one AC terminal of one full-bridge converter to the other AC terminal of another full-bridge converter. The voltage source V1 in the temperature protection branch of the temperature protection circuit corresponding to the power module block 601 is composed of a capacitor C1 and a 24V Zener diode ZD1 connected in parallel. A diode D1 is coupled to a resistor R1 for rectification. One end of the resistor R1 is coupled to the anode of the bus capacitor Cb, and the other end is coupled to the cathode of the Zener diode ZD1 and one end of the capacitor C1. The anode of the Zener diode ZD1 is coupled to the other end of the capacitor C1 and to the potential midpoint N1 of the power converter. At this time, the maximum potential difference between the contact of the temperature switch S1 and the outer casing is 24V.

Accordingly, the temperature protection circuit for the power converter of the embodiment of the present disclosure has a simple structure of a circuit, a voltage source, an isolation transformer, a temperature switch. The circuit structure has a low cost. The temperature switch may withstand a low voltage. Since there is no problem of withstanding voltage for the temperature switch, the reliability can be high and the temperature switch can work for a long time.

The present disclosure has been described by the above-described related embodiments. However, the above embodiments are merely examples for implementing the present disclosure. It must be noted that the disclosed embodiments do not limit the scope of the disclosure. Rather, variations and modifications made without departing from the spirit and scope of the disclosure fall within the scope of the disclosure.

What is claimed is:

1. A temperature protection circuit for a power converter, the power converter comprising a control circuit, a plurality of driving circuits, a plurality of power semiconductor switch blocks connected in series, and a heat sink, each of the power semiconductor switch blocks comprising at least one power semiconductor switch, wherein
   the power converter further comprises a voltage-withstanding clamping circuit connected between a potential midpoint of the power converter and the heat sink;
   the temperature protection circuit comprises a plurality of temperature protection branches, each of the temperature protection branches comprises a resistor, a voltage source, a temperature switch, and an isolation transformer, the temperature switch comprises a contact of the temperature switch and a base, and the base is disposed on the heat sink; and
   each of the temperature protection branches corresponds to one of the power semiconductor switch blocks, and a first end of the resistor of each of the temperature protection branches is coupled to an output electrode of the power semiconductor switch block, and a second end of the resistor is coupled to a first end of the voltage source and coupled to a first end of the contact of the temperature switch via a primary winding of the isolation transformer, a second end of the voltage source and a second end of the contact of the temperature switch are respectively coupled to the potential midpoint of the power converter, and two ends of a secondary winding of the isolation transformer are respectively coupled to the driving circuit corresponding to the corresponding power semiconductor switch or coupled to the control circuit.

2. The temperature protection circuit according to claim 1, wherein the power semiconductor switch block comprises a power semiconductor switch, and the output electrode of the power semiconductor switch block is a collector or an emitter of the power semiconductor switch in the power semiconductor switch block.

3. The temperature protection circuit according to claim 1, wherein the power semiconductor switch block comprises a plurality of power semiconductor switches, and the output electrode of the power semiconductor switch block is a collector or an emitter of one of the plurality of power semiconductor switches.

4. The temperature protection circuit according to claim 1, wherein the power converter comprises N power semiconductor switch blocks, where N is a natural number;
   when N is an odd number, the potential midpoint of the power converter is a connection point between the $((N-1)/2)^{th}$ power semiconductor switch block and the $((N+1)/2)^{th}$ power semiconductor switch block of the power converter, or a connection point between the $((N+1)/2)^{th}$ power semiconductor switch block and the $((N+3)/2)^{th}$ power semiconductor switch block of the power converter;
   when N is an even number, the potential midpoint of the power converter is a connection point between the $(N/2)^{th}$ power semiconductor switch block and the $(N/2+1)^{th}$ power semiconductor switch block of the power converter.

5. The temperature protection circuit according to claim 1, wherein when the contact of the temperature switch of at least one of the temperature protection branches is closed, the secondary winding of the isolation transformer of the temperature protection branch is configured to output a temperature protection signal to the driving circuit corresponding to the power semiconductor switch block which corresponds to the temperature protection branch, and the driving circuit is configured to output an turned-off driving signal to drive the power semiconductor switch corresponding to the driving circuit to be turned off.

6. The temperature protection circuit according to claim 5, wherein the driving circuit is configured to transmit the received temperature protection signal to the control circuit to cause the control circuit to output a turn-off control signal, to control the power semiconductor switch in each of the power semiconductor switch blocks to be turned off.

7. The temperature protection circuit according to claim 1, wherein when the contact of the temperature switch of at least one of the temperature protection branches is closed, the secondary winding of the isolation transformer of the temperature protection branch is configured to output a temperature protection signal to the control circuit, and the control circuit is configured to output a turned-off control signal to control the power semiconductor switch in each of the power semiconductor switch blocks to be turned off.

8. The temperature protection circuit according to claim 1, wherein the voltage source of each of the temperature protection branches comprises a Zener diode and a capacitor connected in parallel, a cathode of the Zener diode is coupled to a first end of the capacitor and a second end of the resistor, an anode of the Zener diode is coupled to a second end of the capacitor and the potential midpoint of the power converter.

9. The temperature protection circuit of claim 8, wherein each of the temperature protection branches further comprises a diode, an anode of the diode is coupled to the second end of the resistor, and a cathode of the diode is coupled to the cathode of the Zener diode.

10. The temperature protection circuit according to claim 1, wherein when a power semiconductor switch in the power semiconductor switch block is turned on or off, a potential difference occurs between the output electrode and the heat sink.

11. A temperature protection circuit for a power converter, the power converter comprising a control circuit, a plurality of driving circuits, a plurality of power module blocks connected in cascade, and a heat sink, each of the power module blocks comprising at least one power module, wherein
the power converter further comprises a voltage-withstanding clamping circuit connected between a potential midpoint of the power converter and the heat sink;
the temperature protection circuit comprises a plurality of temperature protection branches, each of the temperature protection branches comprises a resistor, a voltage source, a temperature switch, and an isolation transformer, the temperature switch comprises a contact of the temperature switch and a base, and the base is disposed on the heat sink; and
each of the temperature protection branches corresponds to one of the power module blocks, and a first end of the resistor of each of the temperature protection branches is coupled to a DC terminal of the power module block, and a second end of the resistor is coupled to a first end of the voltage source and coupled to a first end of the contact of the temperature switch via a primary winding of the isolation transformer, a second end of the voltage source and a second end of the contact of the temperature switch are respectively coupled to the potential midpoint of the power converter, and two ends of a secondary winding of the isolation transformer are respectively coupled to the driving circuit corresponding to the corresponding power module or coupled to the control circuit.

12. The temperature protection circuit according to claim 11, wherein the power module block comprises a power module,
the power module comprises a DC bus capacitor, and the DC terminal of the power module is a positive terminal or a negative terminal of the DC bus capacitor; or
the power module comprises a DC bus capacitor block, the DC bus capacitor block comprises two DC bus capacitors connected in series, and the DC terminal of the power module block is a positive terminal or a negative terminal of the DC bus capacitor block or a connection point between the two DC bus capacitors.

13. The temperature protection circuit according to claim 11, wherein the power module block comprises a plurality of power modules, each of the power modules comprises one DC bus capacitor, and the DC terminal of the power module block is a positive terminal or a negative terminal of the DC bus capacitor of one of the power modules.

14. The temperature protection circuit of claim 11, wherein the power module block comprises a plurality of power modules, each of the power modules comprises two DC bus capacitors connected in series, and the DC terminal of the power module block is a positive terminal or a negative terminal of the DC bus capacitor block of one of the power modules or a connection point between the two DC bus capacitors.

15. The temperature protection circuit according to claim 11, wherein the power converter comprises N power module blocks, where N is a natural number;
when N is an odd number, the potential midpoint of the power converter is a connection point between the $((N-1)/2)^{th}$ power module block and the $((N+1)/2)^{th}$ power module block in the power converter, or a connection point between the $((N+1)/2)^{th}$ power module block and the $((N+3)/2)^{th}$ power module block in the power converter;
when N is an even number, the potential midpoint of the power converter is a connection point between the $(N/2)^{th}$ power module block and the $(N/2+1)^{th}$ power module block.

16. The temperature protection circuit according to claim 11, wherein when the contact of the temperature switch of at least one of the temperature protection branches is closed, the secondary winding of the isolation transformer of the temperature protection branch is configured to output a temperature protection signal to the driving circuit corresponding to each of the power modules in the power module block which corresponds to the temperature protection branch, and the driving circuit is configured to output an turned-off driving signal to drive the power semiconductor switch in the power module corresponding to the driving circuit to be turned off.

17. The temperature protection circuit according to claim 16, wherein the driving circuit is configured to transmit the received temperature protection signal to the control circuit to cause the control circuit to output a turn-off control signal, to control the power semiconductor switch in each of the power module to be turned off.

18. The temperature protection circuit according to claim 11, wherein when the contact of the temperature switch of at least one of the temperature protection branches is closed, the secondary winding of the isolation transformer of the temperature protection branch is configured to output a temperature protection signal to the control circuit, and the control circuit is configured to output a turned-off control signal to control the power semiconductor switch in each of the power module to be turned off.

19. The temperature protection circuit according to claim 11, wherein the power module is one of a full-bridge converter, a half-bridge converter, a neutral point clamped three-level converter, a diode clamped three-level converter, a flying capacitor three-level converter, a full-bridge resonant converter, and a half-bridge resonant converter.

20. The temperature protection circuit according to claim 11, wherein the voltage source of each of the temperature protection branches comprises a Zener diode and a capacitor connected in parallel, a cathode of the Zener diode is coupled to a first end of the capacitor and a second end of the resistor, an anode of the Zener diode is coupled to a second end of the capacitor and the potential midpoint of the power converter.

\* \* \* \* \*